US006187092B1

(12) United States Patent
Wollesen

(10) Patent No.: US 6,187,092 B1
(45) Date of Patent: Feb. 13, 2001

(54) METHOD AND APPARATUS FOR CONTROLLING THE THICKNESS OF A GATE OXIDE IN A SEMICONDUCTOR MANUFACTURING PROCESS

(75) Inventor: Donald L. Wollesen, Saratoga, CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/033,642

(22) Filed: Mar. 3, 1998

Related U.S. Application Data

(62) Division of application No. 08/885,140, filed on Jun. 30, 1997.
(51) Int. Cl.⁷ ................................................. H07L 21/31
(52) U.S. Cl. ........................................... 117/202; 438/770
(58) Field of Search ................................... 117/200–202; 438/770–774

(56) References Cited

U.S. PATENT DOCUMENTS 4,267,205 * 5/1981 Pastor et al. ........................... 427/93
4,282,270 * 8/1981 Nozaki et al. ......................... 427/93

OTHER PUBLICATIONS

Kinetics of Oxide Growth, "Thermal Oxidation", The Physics and Technology of Semiconductor Devices, pp. 22–23.

* cited by examiner

Primary Examiner—David Hardy

(57) ABSTRACT

A method and apparatus for controlling the growth of an oxide, such as a gate oxide, in a semiconductor device manufacturing process takes into consideration the ambient atmospheric pressure in order to reduce the variance in gate oxide thicknesses between wafer lots. The pressure in the oxide diffusion tube is maintained at a constant pressure near the ambient atmospheric pressure during the oxide diffusion process. Alternatively, the furnace time is changed from lot to lot as a function of changes in the ambient atmospheric pressure in order to maintain the gate oxide thickness at a constant value between wafer lots.

4 Claims, 5 Drawing Sheets

_US 6,187,092 B1_

METHOD AND APPARATUS FOR CONTROLLING THE THICKNESS OF A GATE OXIDE IN A SEMICONDUCTOR MANUFACTURING PROCESS

This application is a Divisional of application Ser. No. 08/885,140 filed Jun. 30, 1997.

TECHNICAL FIELD OF THE INVENTION

The present invention relates to the field of semiconductor manufacturing processes, and more particularly, to the formation of an oxide layer during the manufacturing process.

BACKGROUND OF THE INVENTION

The formation of oxide layers are important steps in the manufacturing of semiconductor devices. In thermal oxidation, an oxide film is grown on a slice of silicon by maintaining the silicon in an elevated temperature in an oxidizing ambient, such as dry oxygen or water vapor. Thermally grown silicon dioxide is used to form a stable gate oxide for field effect devices, for example.

Controlling the gate oxide thickness is an important manufacturing process control issue. As the gate oxide thickness is reduced to below 150 Å, the growth kinetics changes from parabolic to linear with time. This is explained in Grove, The Physics and Technology of Semiconductor Devices, pages 22–33. In other words, for gate oxides, once the thickness is above 150 Å, it is a self-limiting process and therefore makes it easier to control the gate oxide thickness and reduce the variance between devices. However, for gate oxides of less than 150 Å, the linearity of the growth kinetics with time makes control over the gate oxide thickness much more difficult. The oxide thickness as a function of time may be expressed as:

$$\frac{X_o}{A/2} = \sqrt{1 + \frac{t + \tau}{A^2/4B}} - 1$$

where:

$$A \equiv 2D\left(\frac{1}{k_s} + \frac{1}{h}\right)$$

$$B \equiv \left(\frac{2DC^*}{N_1}\right)$$

and, $$\tau = \frac{x_i^2 + Ax_i}{B}$$

and $$C^* = Hp_G$$

with

H=Henry's Law constant
$p_G$=bulk gas pressure
D=Diffusivity of $O_2$ is Si
$N_1$=2.2×10$^{22}$ $SiO_2$ molecules/cm$^3$ in the oxide
$k_s$=chemical surface-reaction rate constant for oxidation
h=gas phase mass transfer coefficient In a typical oxide/diffusion arrangement, a wafer carrier is positioned within an oxide diffusion tube, this wafer carrier holding a number of wafers on which a gate oxide layer is to be grown. The processing of the wafers in the oxide diffusion tube, usually made of quartz, involves providing a supply of gas containing the oxidizing medium, such as oxygen or water vapor, so that it flows through the oxide diffusion tube. An oxidation furnace concentrically surrounding the oxide diffusion tube is used to heat the tube. The process is normally performed at ambient atmospheric pressure.

The thickness of the oxide layer is normally controlled through varying either the temperature and/or the furnace time, i.e. the amount of time the wafers are subjected to the gas containing the oxidizing medium and the elevated temperature. Although strict control is made of the temperature and the flow of gas through the oxide diffusion tube the variance in the gate oxide thickness tends to be approximately ten percent.

SUMMARY OF THE INVENTION

There is a need for a method and apparatus for growing gate oxide in a manner that will provide a more accurate control of the gate oxide thickness so that there will be less variance in the thickness of the gate oxide in the final product.

This and other needs are met by embodiments of the present invention which provide a method for controlling the growth of an oxide in a semiconductor device manufacturing process. The present invention recognizes that the thickness of the oxide is proportional to the bulk gas pressure. Normally, the oxidation diffusion process is performed at ambient atmospheric pressure. However, the standard atmospheric pressure varies on a regular basis according to weather patterns, for example from 28 mm Hg to 32 mm Hg. Hence, the pressure may easily vary by approximately 6 or 7 percent. Accordingly, in certain embodiments of the present invention, the pressure of the gas within the oxide diffusion tube is maintained at a constant pressure. Unlike pressure diffusion tubes that have been used in the past to provide diffusion at greatly elevated pressures of several atmospheres in order to speed up the diffusion process, in the present invention the pressure is maintained at approximately ambient atmospheric pressure. With the pressure maintained at a constant value, and assuming that the temperature and gas flows are regulated as normal, the variance in the gate oxide thickness is reduced.

The earlier stated needs are also met by other embodiments of the invention which provide a method of controlling the growth of an oxide in a semiconductor device manufacturing process, in which an ambient atmospheric pressure is determined. Rather than controlling the pressure in the oxide diffusion tube, the amount of time the wafer is subjected to the elevated temperature is controlled as a function of the determined ambient atmospheric pressure and the temperature to which the wafer will be subjected. In other words, although the pressure is not maintained constant, the furnace time will be set to account for the actual ambient atmospheric pressure.

The earlier stated needs are also met by an arrangement for controllably growing an oxide layer on a wafer in a semiconductor device manufacturing process. This arrangement includes an oxide diffusion tube and a gas supply arrangement that maintains the constant gas pressure within the oxide diffusion tube during the growing of the oxide layer on the wafer. This constant gas pressure is approximately ambient atmospheric pressure. The use of a gas pressure that is approximately ambient atmospheric pressure, rather than a high pressure system, avoids the added danger and expense involved with such systems. The present invention can therefore be used with conventional oxide diffusion tube systems if provided with a gas supply arrangement that maintains a constant gas pressure as provided in the present invention.

In other embodiments of the invention, an ambient pressure monitor is used to determine the ambient atmospheric pressure. A control arrangement is coupled to the ambient pressure monitor and to the heater that heats the oxide diffusion tube. The control arrangement controls the heater to heat the oxide diffusion tube for an amount of time that is a function of the determined ambient atmospheric pressure. This setting of the furnace time may be done manually, automatically, or even dynamically, in response to a changing ambient atmospheric pressure, which tends not to change very rapidly.

By reducing the variance in the thickness of the gate oxide, speed variances in microprocessors forming the final product will be reduced. Furthermore, a better control will be achieved for tunnel oxides on flash memories and electrically erasable memory cells.

The foregoing and other features, aspects and advantages of the present invention will become more apparent from the following detailed description of the present invention when taken in conjunction with the accompanying drawings.

DETAILED DESCRIPTION OF THE ILLUSTRATIVE EMBODIMENTS

Figure 1:
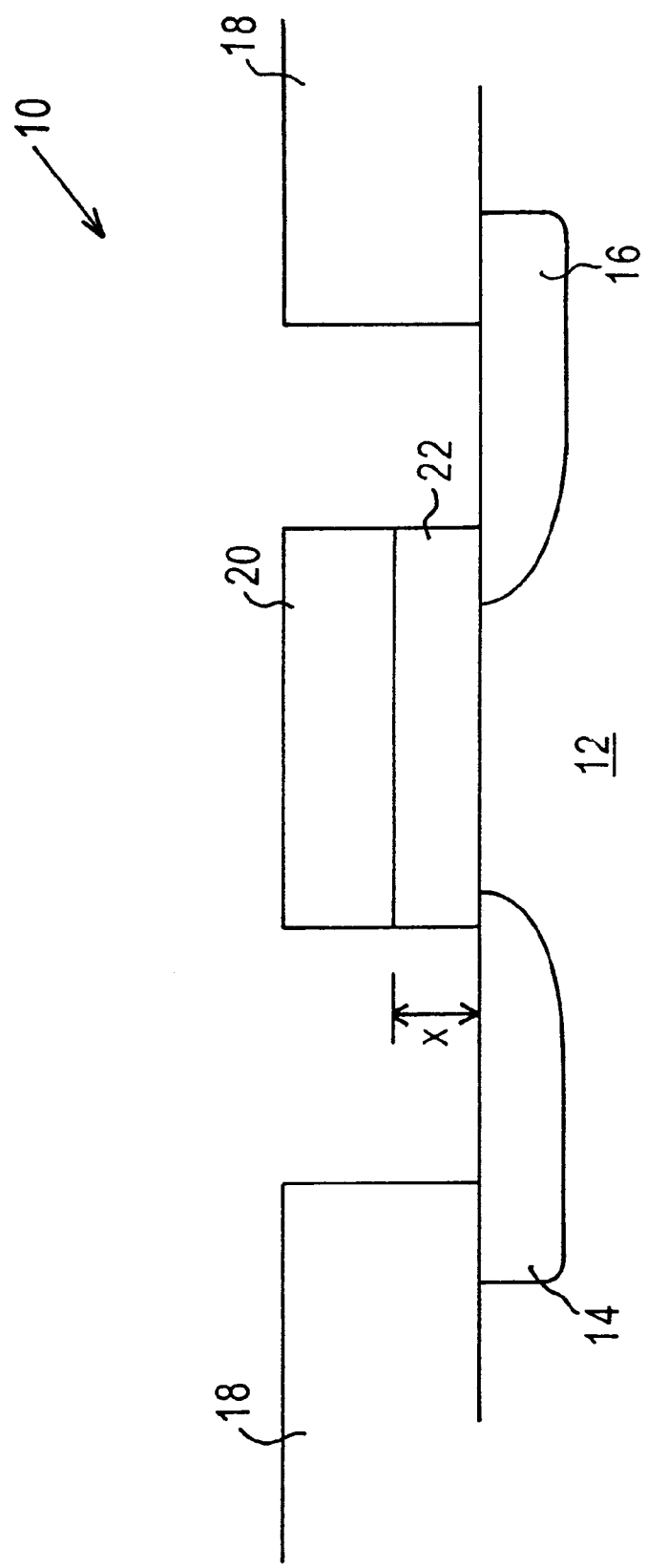
FIG. 1 is a schematic cross-sectional view of a semiconductor device.

FIG. 1 is a cross-sectional view of an exemplary semiconductor device 10 to depict gate oxide. The device 10 includes a silicon substrate 12 that has a source region 14 and a drain region 16. Field oxide 18 is provided and a gate 20 is located over gate oxide 22. The thickness of the gate oxide 22 is represented as x. The present invention improves upon the variance in the gate oxide thickness x that is produced between wafers and wafer lots in the manufacturing process. Reducing the variance allows an improvement in the gate oxide control, and in turn, permits tighter distributions that depend on the gate oxide control. This includes microprocessor speed and write/erase cycles on programmable cells. It also improves the gate oxide reliability control.

It is to be understood that the present invention will be described with the example of thermal oxidation to create a gate oxide. However, the present invention is also applicable to formation of other types of oxide layers in addition to gate oxide layers. It is also applicable to other thermal oxides such as silicon oxynitride, thermal oxides, or thermal nitridation.

The present invention recognizes that a variance in the atmospheric pressure from the standard assumed ambient atmospheric pressure of 29.92 mmHg will vary the thickness x of the gate oxide 22. The present invention either maintains a constant gas pressure in an oxide diffusion tube, or varies the furnace time as a function of the actual measured ambient atmospheric pressure. By using either of these embodiments to control the oxide diffusion process, the gate oxide thickness x in various wafer lots will exhibit a variance that is much reduced than if the ambient atmospheric pressure was not taken into consideration.

Figure 2:
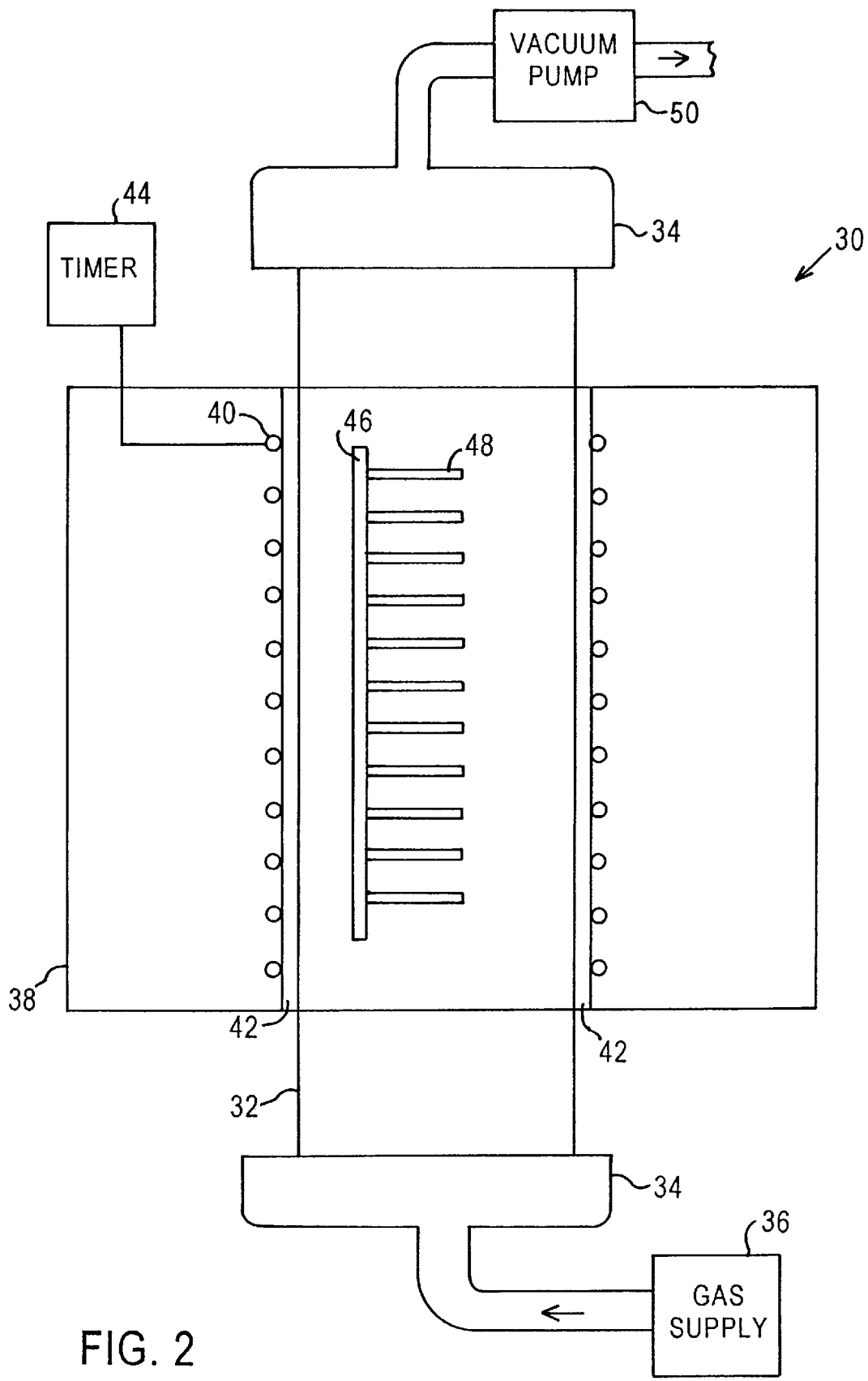
FIG. 2 is a sectional schematic depiction of an arrangement for growing oxide on a semiconductor wafer in accordance with an embodiment of the present invention.

FIG. 2 is a sectional schematic depiction of a oxide diffusion arrangement in accordance with an embodiment of the present invention. The arrangement 30 includes an oxide diffusion tube 32 that is sealed at its ends by end caps 34. In typical installations, the tube 32 is made of quartz and is vertical, although tube 32 may also be horizontal. A gas supply 36 is coupled to the inlet of one of the end caps 34. The gas supply 36 provides the carrier gas and the reaction gas. Typically, the mix of gas includes nitrogen, argon and oxygen.

An oxidation furnace 38 surrounds the oxide diffusion tube 32. A liner 42 separates the oxide diffusion tube 32 from a heater core 40. A timer 44 controls the amount of time that the heater core will be heated (e.g., the furnace time).

Wafers 48 are loaded into the oxide diffusion tube on a wafer carrier 46. The furnace time for heating the heater core 40 in the oxidation furnace 38 is controlled by a timer 44. For a given gate oxide thickness, the timer will be set to a specific time, and this time will be slightly varied according to the measured atmospheric pressure.

Although the setting of the timer to the same time for two different lots of wafers should theoretically produce gate oxides having the same thickness, variations in the ambient atmospheric pressure will cause the thickness to vary from lot to lot. In order to overcome this problem, the embodiment of the present invention in FIG. 2 provides a vacuum pump 50 at the exhaust of the oxide diffusion tube 32. The vacuum pump 50 creates in the oxide diffusion tube 32 a slight negative pressure with respect to ambient atmospheric pressure. For example, the pressure created by the vacuum pump 50 may be set to a value in a range from approximately one half atmospheres below ambient atmospheric pressure to just slightly below atmospheric pressure. For example, if ambient atmospheric pressure is 29.92 mm Hg, the pressure in the oxide diffusion tube 32 may be regulated to be 26 mm Hg. The vacuum pump 50 has a regulating element to maintain the pressure at a constant pressure in certain embodiments. As will be apparent to those of ordinary skill in the art, the regulator may instead be a separate component from the vacuum pump 50.

The arrangement 30 of the present invention operates at near ambient atmospheric pressure, and therefore avoids the dangers and added expense inherent in pressure diffusion arrangements,. in which the oxide diffusion tube is pressurized to several atmospheres. The disadvantage of the pressurized diffusion tubes has made oxide diffusion at ambient atmospheric pressure the standard in the semiconductor industry.

Figure 3:
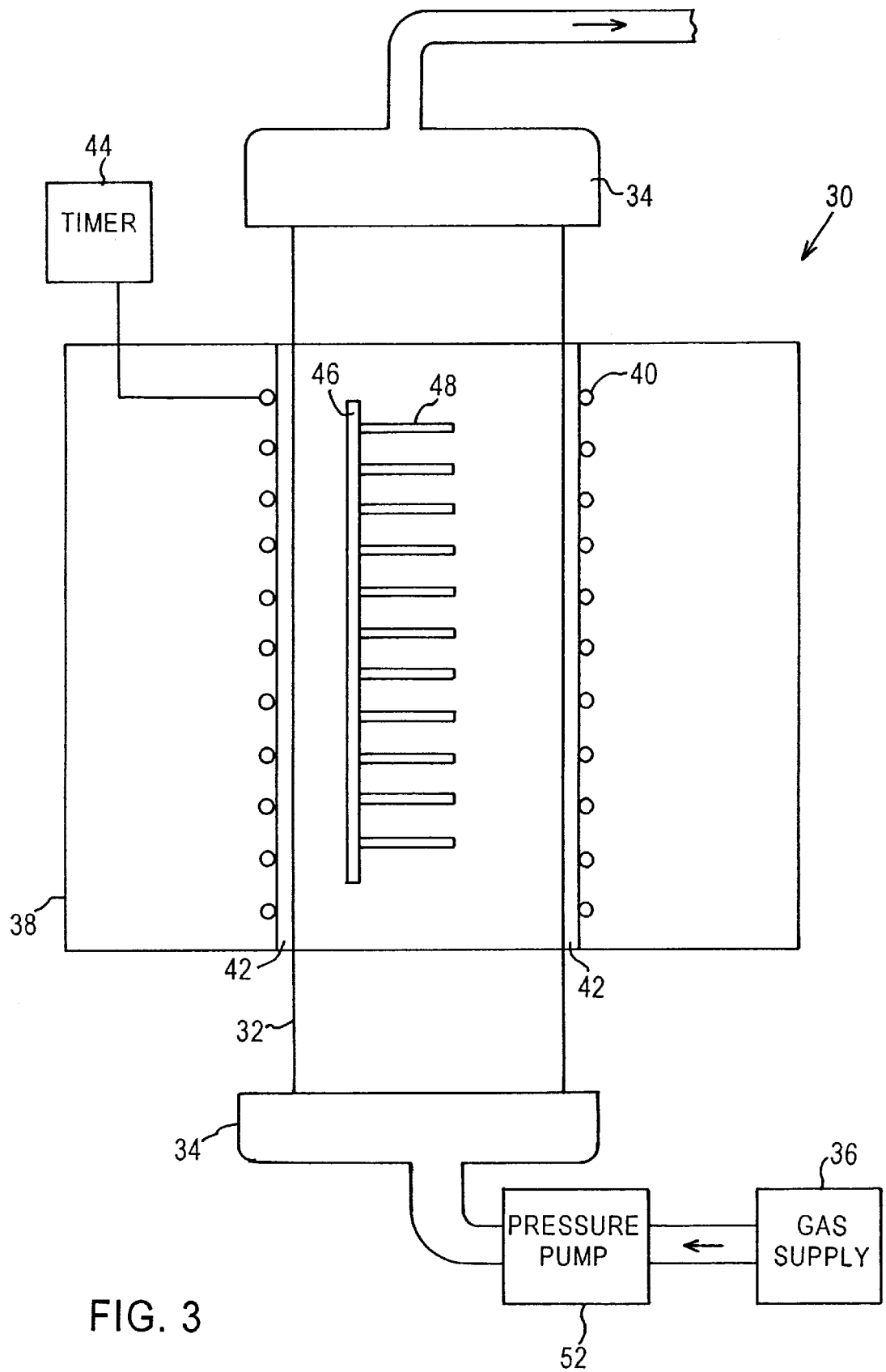
FIG. 3 is a sectional schematic depiction of an arrangement for growing oxide on a semiconductor wafer for another embodiment of the present invention.

FIG. 3 depicts another embodiment of the present invention in which the gas in the oxide diffusion tube is pressurized to slightly above ambient atmospheric pressure, (such as 32 mm Hg) up to, for example, approximately one half atmosphere above ambient atmospheric pressure. For this purpose, a pressure pump 52 (with an appropriate regulator) is employed to maintain the constant gas pressure within the oxide diffusion tube 32 for the duration of the oxide diffusion process. In the embodiments of FIGS. 2 and 3, the vacuum pump 50 and the pressure pump 52 can be located at either end of the diffusion tube as there is not a significant pressure drop across the tube 32.

With both of the embodiments of FIGS. 2 and 3, the furnace time between wafer lots as controlled by the timer 44 will remain the same, and the pressure in the oxide diffusion tube 32 will also be maintained at a constant value according to the present invention. Since both the temperature and the pressure are maintained constant from lot to lot, in both of the embodiments of FIGS. 2 and 3, the variance in the gate oxide thickness will be reduced in comparison to the prior art methods which operate at ambient atmospheric pressure but do not take into account the variations in the ambient atmospheric pressure.

Figure 4:
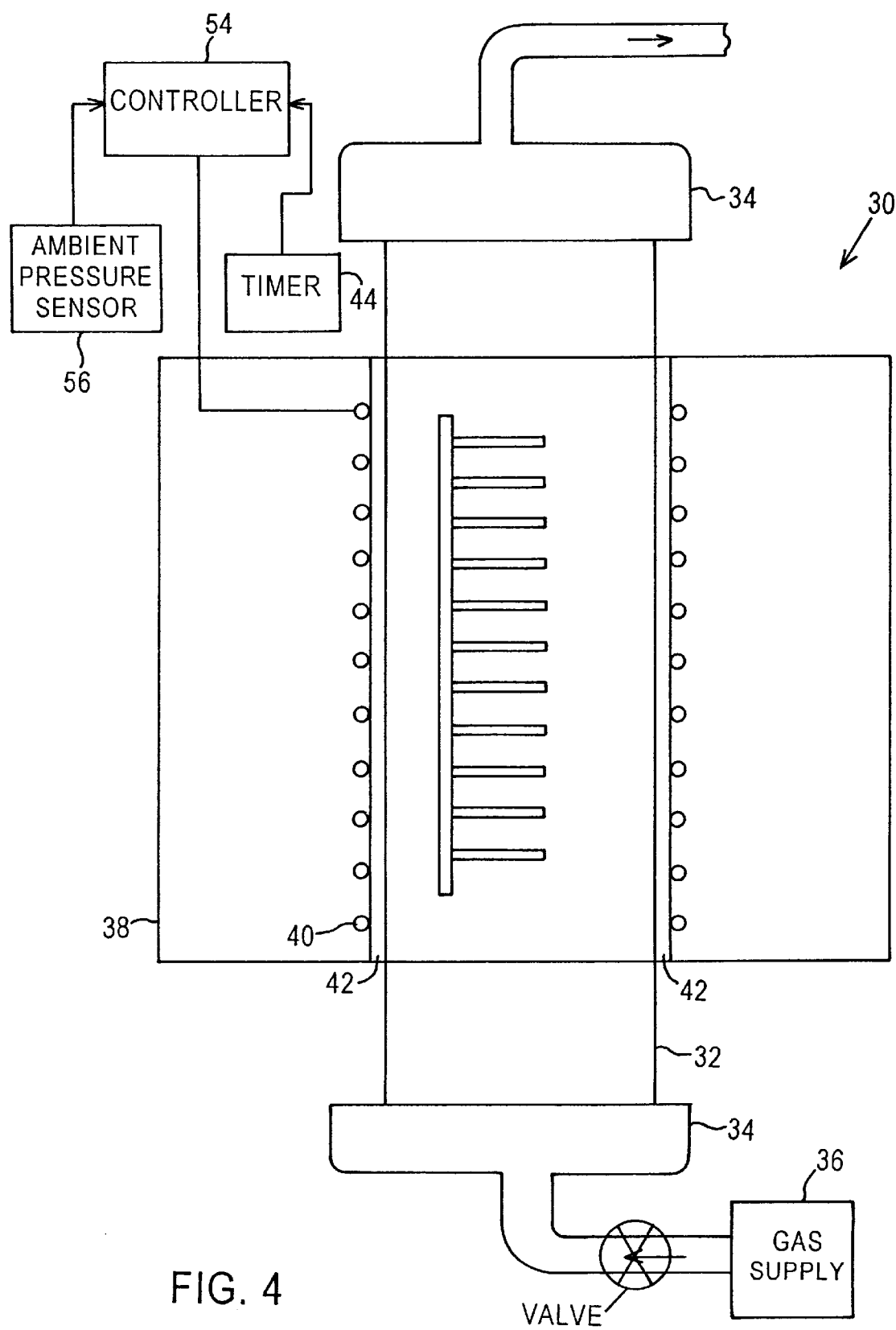
FIG. 4 is a sectional schematic depiction of an arrangement for growing oxide on a semiconductor wafer for still another embodiment of the present invention.

FIG. 4 depicts an additional embodiment of the present invention in which the pressure in the oxide diffusion tube is not regulated. However, in this embodiment, the ambient atmospheric pressure is taken into consideration in the oxide diffusion process to adjust other oxide diffusion control parameters.

A controller 54 receives signals from an ambient pressure sensor 56 that detects the actual ambient atmospheric pressure in the area of the oxide diffusion tube 32. Based on the actual value of the ambient atmospheric pressure, the controller 54 will set the timer 44 to control the furnace time in order to control the gate oxide thickness to be the same from lot to lot. For example, assume that for lot 1 the ambient atmospheric pressure, as determined by the ambient pressure sensor 56, is at 29.92 mm Hg. The timer will be set at a specific value $t_1$ to achieve a desired gate oxide thickness x. Now assume for lot 2 that the ambient pressure has increased to 31 mm Hg. Since the gate oxide thickness is proportional to the bulk gas pressure, the gate oxide thickness x will be achieved in a shorter time period than for lot 1. Accordingly, timer 44 is set to a shorter time $t_2$ for lot 2 than it was for lot 1 in order to achieve the same gate oxide thickness x in the wafers of lot 2 as was achieved for the wafers of lot 1. Conversely, if the ambient pressure is less than 29.92 mm Hg when a third lot of wafers is to be processed in the oxide diffusion tube 32, the controller 54 will set the timer 44 to increase the amount of time $t_3$ of the oxide diffusion process (i.e., the furnace time) to maintain a gate oxide thickness x.

The embodiment of FIG. 4 depicts an automatic control of the timer 44 through controller 54 and an ambient pressure sensor 56 that provides a signal to the controller 54. The timer 44 may be set by the controller 54 at the beginning of the oxide diffusion process so that the amount of time that the wafer is subjected to the temperature will remain the same throughout the oxide diffusion process. Alternatively, the time can be controlled dynamically in a feedback control method. Thus, if the ambient pressure changes during the oxide diffusion process, the controller 54 may lengthen or shorten the amount of time (through the timer 44) of heating by the oxidation furnace 38. Alternatively, the timer 44 may be manually set by an operator who has measured the ambient atmospheric pressure with a barometer and set the timer 44 accordingly to account for the actual value of the ambient atmospheric pressure. This method therefore bypasses the controller 54 and the ambient pressure sensor 56, but does not provide dynamic feedback for changing ambient pressure conditions.

Figure 5:
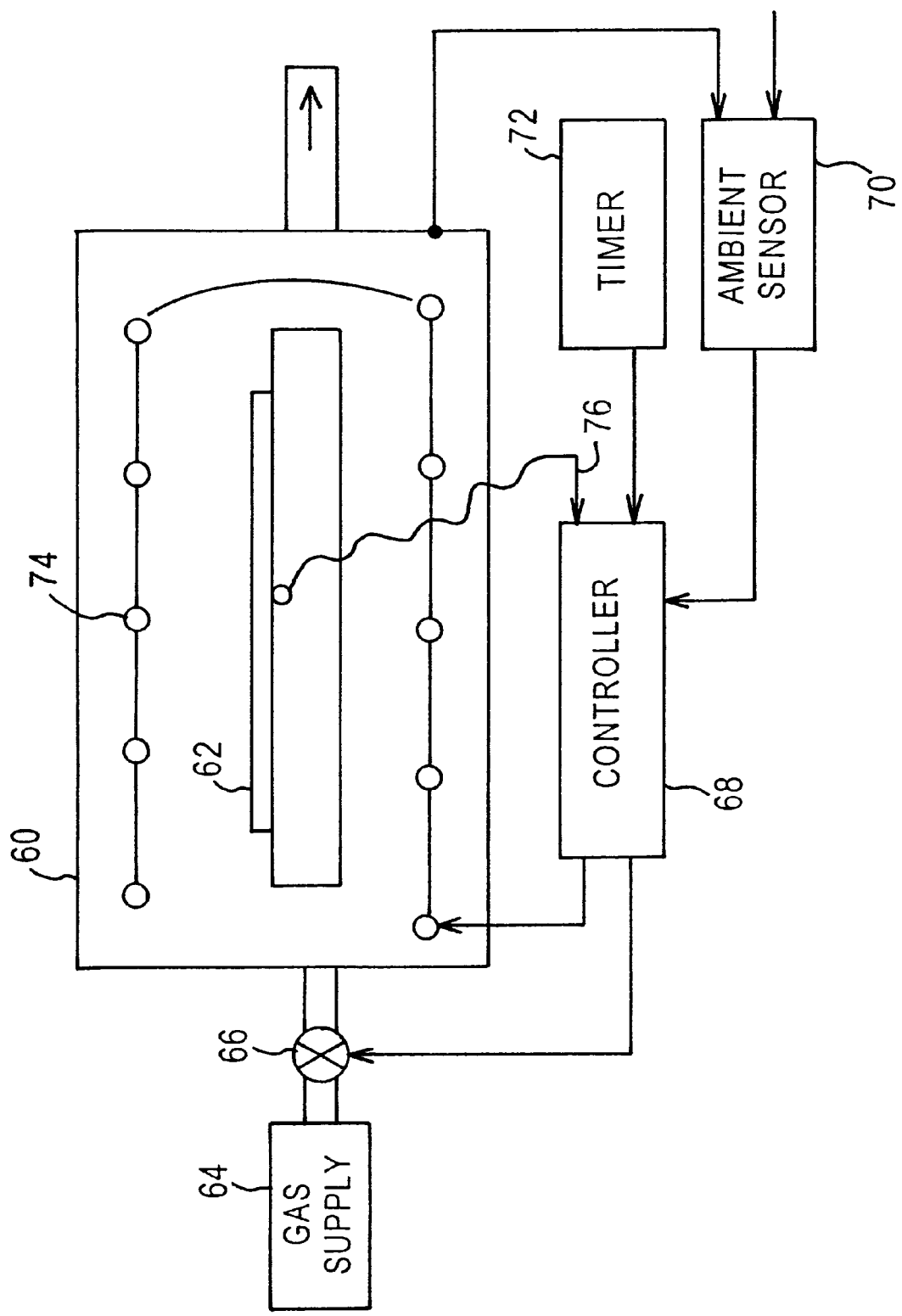
FIG. 5 is a sectional schematic depiction of a rapid thermal oxidation arrangement for another embodiment of the present invention.

Although the present invention has been described thus far with the example of thermal oxidation/diffusion tubes, the above-described techniques are also applicable to RTO (rapid thermal oxidation) equipment and techniques. An exemplary embodiment of an RTO process arrangement is depicted in FIG. 5. An RTO chamber 60 receives a wafer 62 (or a plurality of wafers 62) that is to be processed. Supply gas is provided to the chamber 60 from a gas supply 64 through a valve 66 that is under the control of a controller 68. An ambient sensor 70 compares the atmospheric pressure to the pressure of the chamber atmosphere and provides a comparison signal to the controller 68. A timer 72 provides the furnace time for the wafers 62 in the chamber 60 to the controller 68. The chamber 60 is heated by, for example, infrared lamps 74. The temperature in the chamber 60 is determined from a value provided by a thermocouple 76 to the controller 68.

The control of the RTO process equipment depicted in FIG. 5 is the same as in the embodiment of the invention depicted in FIGS. 2–4.

The present invention reduces the variance in the thickness of oxide layers, such as gate oxide, by taking into consideration the actual ambient atmospheric pressure. The present invention allows existing oxide diffusion arrangements at ambient atmospheric pressures to be retrofitted at low expense to control the pressure in the oxide diffusion tube during the oxide diffusion process. Alternatively, the amount of time of the oxide diffusion process is changed in certain embodiments to account for differences in the ambient atmospheric pressure from the standard, assumed atmospheric pressure. Again, this reduces the variation in the gate oxide thickness from lot to lot.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. An arrangement for controllably growing an oxide layer on an object in a semiconductor device manufacturing process, comprising:

an oxide diffusion tube;

an ambient pressure monitor that determines an ambient atmospheric pressure;

a heater in thermal contact with the oxide diffusion tube to controllably heat the oxide diffusion tube;

a control arrangement coupled to the ambient pressure monitor and to the heater, the control arrangement controlling the heater to heat the oxide diffusion tube for an amount of time that is a function of the determined ambient atmospheric pressure.

2. The arrangement of claim 1, wherein the control arrangement includes means for dynamically controlling the heater in response to changes in the ambient atmospheric pressure during the growing of an oxide layer.

3. The arrangement of claim 2, wherein the means for dynamically controlling the heater includes means for changing the amount of time the heater will heat the oxide diffusion tube.

4. The arrangement of claim 1, wherein the control arrangement includes means for setting the amount of time the heater will heat the oxide diffusion tube, the amount of time remaining fixed throughout the growing of an oxide layer.

* * * * *